United States Patent [19]
Fayfield et al.

[11] Patent Number: 5,922,219
[45] Date of Patent: Jul. 13, 1999

[54] UV/HALOGEN TREATMENT FOR DRY OXIDE ETCHING

[75] Inventors: Robert T. Fayfield, St. Louis Park, Minn.; Brent D. Schwab, Hudson, Wis.

[73] Assignee: FSI International, Inc., Chaska, Minn.

[21] Appl. No.: 08/739,884

[22] Filed: Oct. 31, 1996

[51] Int. Cl.⁶ .............................. C09K 13/08; C23F 1/12; C23C 22/34
[52] U.S. Cl. ................................ 216/58; 216/79; 216/62; 216/65; 216/66
[58] Field of Search ................................. 216/58, 62, 65, 216/66, 79

[56] References Cited

U.S. PATENT DOCUMENTS

| | | | |
|---|---|---|---|
| 4,264,374 | 4/1981 | Beyer et al. | 134/3 |
| 4,749,440 | 6/1988 | Blackwood et al. | 156/646 |
| 4,857,142 | 8/1989 | Syverson | 156/646 |
| 5,022,961 | 6/1991 | Izumi et al. | 156/646 |
| 5,112,437 | 5/1992 | Watanabe et al. | 156/646 |
| 5,178,721 | 1/1993 | Sugino | 156/626 |
| 5,234,540 | 8/1993 | Grant et al. | 156/646 |
| 5,326,406 | 7/1994 | Kaneko et al. | 134/1 |
| 5,439,553 | 8/1995 | Grant et al. | 216/58 |
| 5,534,107 | 7/1996 | Gray et al. | 156/643.1 |
| 5,762,755 | 6/1998 | McNeilly et al. | 156/652.1 |
| 5,814,156 | 9/1998 | Elliott et al. | 134/1 |

FOREIGN PATENT DOCUMENTS

| | | |
|---|---|---|
| 0246802 A2 | 11/1987 | European Pat. Off. . |
| 0 688 045 A1 | 12/1996 | European Pat. Off. . |
| 96/19825 | 1/1996 | WIPO . |

*Primary Examiner*—John M. Ford
*Attorney, Agent, or Firm*—Vidas, Arrett & Steinkraus

[57] ABSTRACT

The uniformity of $SiO_2$ etching over the surface area of a substrate using a conventional $SiO_2$ etching reaction, such as a HF/ROH reaction where R is H or alkyl, is improved when the substrate is pretreated before the etch reaction. In the pretreatment the substrate within a process chamber is exposed to UV illuminated halogen gas. Suitable halogen gases are fluorine and chlorine. Oxygen may optionally also be included with the halogen gas. The pretreatment renders the etching uniformity results substantially independent of the storage history of the wafer.

21 Claims, 1 Drawing Sheet

UV/HALOGEN TREATMENT FOR DRY OXIDE ETCHING

BACKGROUND OF THE INVENTION

In the manufacture of semiconductor devices there are many process steps hich involve removal of silicon oxide. A number of known protocols for silicon oxide etch use a liquid or gas phase mixture of HF and a catalyst such as ROH where R is or alkyl (i.e. ROH=water or an alcohol). More recently gas phase systems using UV illuminated fluorine or fluorine interhalogen gas have also been described for this purpose.

It has long been known that gas phase HF/water mixtures can be used to etch various silicon oxide films. Early references include J. P. Holmes, et al, "A Vapor Etching Technique for the Photolithography of Silicon Dioxide," *Microelectronics and Reliability,* 5 pp 337–341 (1966); and K. Breyer, et al, "Etching of $SiO_2$ in Gaseous $HF/H_2O$," *IBM Technical Bulletin,* 19(7) (12/1976), both of which used a HF/water azeotrope.

In U.S. Pat. No. 4,749,440 (Blackwood), a process for removing silicon oxide films from silicon wafers using anhydrous HF gas and water vapor carried in a nitrogen stream is disclosed. The gases are mixed just prior to entering a process chamber. The products are gaseous and are removed by the inert nitrogen carrier gas. This process has an advantage over previous liquid phase etching procedures in reduced heavy metals deposits, which are often introduced during rinse steps, and in reduced environmental problems. Additionally, the use of anhydrous HF provides improved process control compared to prior gas phase HF/water processes in which HF is supplied as an azeotrope with water. An ambient pressure apparatus for performing this process is currently commercially available from FSI International, Inc., under the trademark Excalibur®.

Various publications describe HF/alcohol processes for etching silicon oxide.

Liquid phase reactions in which HF/alcohol mixtures are applied to a rapidly spinning silicon wafer under $N_2$ in a glove box reaction chamber to remove silicon oxide are described in F. J. Grunthaner, et al, "Local Atomic and Electronic Structure of Oxide/GaAs and $SiO_2$/Si Interfaces Using High-Resolution XPS," *J. Vac. Technol.,* 16 (5) 1443–1453 (1979); F. J. Grunthaner, et al, "Chemical and Electronic Structure of the $SiO_2$/Si Interface," *Materials Science Reports,* 69 (at 82–86 & 130–160) (1986); W. J. Kaiser, et al, "Scanning Tunneling Microscopy Characterization of the Geometric and Electronic Structure of Hydrogen-Terminated Silicon Substrates," *J Vac. Soc. A,* 6 (2), 519–523 (4/1988); and D. B. Fenner, et al, "Silicon Surface Passivation by Hydrogen Termination: A Comparative Study of Preparative Methods," *J. Appl. Phys.,* 66(1) pp 419–424 (7/89). J. L. Prom, et al, "Influence of the Preoxidation Cleaning on the Electrical Properties of Thin $SiO_2$ Layers," *IEE Proceedings, Pt* 1, 135, (1), 20–22 (2/88), reports use of a HF and ethanol (1:10) immersion as the last step in a preoxidation cleaning.

U.S. Pat. No. 5,022,961, (Izumi), describes a process for removing a film of a silicon oxide, from a silicon substrate. Two steps are identified:

(a) placing the substrate in a reaction chamber to be isolated and an air-tight manner from the outside air, and (b) feeding anhydrous hydrogen fluoride and alcohol simultaneously into the reaction chamber.

The reference indicates that the HF/alcohol feeds may be as liquid solutions or gas mixtures. A similar disclosure of an ambient pressure gas phase etch process is contained in A. Izumi, et al, "A New Cleaning Method by Using Anhydrous $HF/CH_3OH$ Vapor System," J. Ruzyllo et al, ed., *Symposium on Cleaning Technology in Semiconductor Device Manufacturing,* ECS Proceedings, 92(12), pp 260–266 (1992).

U.S. Pat. No. 5,439,553 (Grant, et al), issued Aug. 8, 1995 from an application filed in the United States on Mar. 30, 1994, describes and claims a process for removing silicon oxide from a wafer substrate in which an HF/alcohol gas mixture is used at a low pressure to minimize condensation. The same process was earlier published in course materials distributed to attendees of a short course entitled "Semi-Conductor Wafer Cleaning Technology" which was held in Austin, Tex. on Feb. 23rd and 24th, 1993, by Werner Kern Associates, East Windsor, N.J. At that short course, one of the inventors of U.S. Pat. No. 5,439,553 also presented a lecture on dry cleaning processes which included a discussion of vapor phase etching of silicon oxide using a HF/methanol process under low pressure conditions where condensation does not occur.

J. Butterbaugh, et al, "Gas Phase Etching of Silicon Oxide with Anhydrous HF and Isopropanol," *Proceedings of the Third International Symposium on Cleaning Technology in Semiconductor Device Manufacturing,* ECS Proceedings, 94(7) pp 374–383 (1994), describe a low pressure HF/isopropanol etch process for silicon oxide.

HF etching systems for silicon oxide removal which do not use added catalyst are reported in N Miki, et al, "Gas-Phase Selective Etching of Native Oxide," *IEEE Transactions on Electron Devices,* 37 pp 107–115 (1/90).

In EP 688045, a method for removing silicon oxides which is less selective for doped oxides than HF based processes is disclosed. The method employs fluorine or a gas photolyzable by UV irradiation to produce monoatomic fluorine species, together with UV irradiation of the substrate.

Several authors at Fujitsu Laboratories, Ltd., have produced publications describing a $UV/Cl_2$ process for cleaning metal contamination from silicon wafer substrates and $UV/F_2/Ar$ and $UV/F_2/H_2$ processes for etching silicon oxide. These publications include T. Ito, "Wafer cleaning with photo-excited halogen radical," *Proceedings—Institute of Environmental Sciences,* 1991, pp 808–813; Aoyama et al, "Removing native oxide from Si(001) surfaces using photoexcited fluorine gas," *Appl. Phys. Lett.,* 59, November 1991, pp 2576–2578; Aoyama et al, "Silicon Surface Cleaning Using Photoexcited Fluorine Gas Diluted with Hydrogen," *J. Electrochem. Soc.,* 140, 1704–1708 (1993); Aoyama et al, "Surface Cleaning for Si Epitaxy Using Photoexcited Fluorine Gas," *J. Electrochem. Soc.,* 140, 366–371 (1993); and U.S. Pat. No. 5,178,721.

As experience with these various gas-phase etch reactions has grown, it has become apparent that the results obtained can be highly variable depending on the handling history of the substrate, particularly with HF/catalyst etch systems. Etch depth and etch uniformity across the wafer may be quite reproducible if a wafer is quickly transferred from an oxide generating furnace to the etch reaction chamber but the reproducibility of the process can quickly deteriorate if the wafer is allowed to be exposed to a clean room environment, or to storage in a vacuum in standard plastic wafer cassettes, for as short as a few minutes. Careful control of the environmental exposure to uniform conditions can alleviate this problem to some extent, but sometimes the handling history is not known or is outside the normal controlled conditions established for a particular etch operation. For instance when a manufacturing sequence process is interrupted just prior to an etch operation due to unusual circumstances and cannot be resumed until sometime outside the time range allowed to initiate etch.

From the investigations leading to the invention it appears that a major source of etch non-uniformity may come from polymer cassettes used to store silicon wafers awaiting processing, particularly under vacuum storage conditions. Thus multiple wafers placed in a holding cassette at the same time after completion of an oxidation reaction and promptly transferred to a vacuum cluster tool apparatus for individual etch processing can display significantly different etch uniformity results depending on how long the wafer sits in the cassette awaiting its turn at the etch processing.

Because the handling history cannot always be controlled, or maintained identical from wafer to wafer, it would be desirable to be able to put a wafer into a condition prior to etching which allows the etch reaction to be reproducible without regard to the handling history. Further it would be desirable to be able to put a wafer into a passivated condition which will render the etch reaction less sensitive to handling history of the wafer between the time the wafer is passivated and the time it is etched. Still further it would be desirable to be able to accomplish these results on substrates of complex composition, including substrates which have areas of exposed silicon.

SUMMARY OF THE INVENTION

The present invention is directed to a process for gas-phase etching of silicon oxide from a substrate, such as a silicon or gallium arsenide wafer substrate, which utilizes a pretreatment of UV illuminated halogen gas, optionally mixed with oxygen, to establish a uniform surface condition prior to the etch step. In particular the invention is an improved gas phase process for etching silicon oxide from a substrate which comprises an etch step in which a substrate having a surface with silicon oxide on at least a portion thereof is etched using a gas phase reactant system, the improvement wherein, prior to said etch step said substrate surface is pretreated by exposure to a UV illuminated halogen gas, or a mixture thereof with oxygen. The pretreatment is particularly advantageous for catalyzed HF etch systems, especially HF/ROH where R is H or alkyl, which have been found to be quite sensitive to wafer handling history. In particular, the invention has shown remarkable improvement in reproducibility of etch uniformity of wafer etch for HF/ROH systems operated at below ambient pressure by etching of single wafers extracted sequentially from a storage cassette holding multiple wafers. Etch depth reproducibility is also good when steps are taken to assure that, after pretreatment, the substrate is brought to a consistent temperature before initiating the etch reaction.

The pretreatment process sets the substrate to a uniform starting condition for the $SiO_2$ etch reaction with little or no regard to the handling history of the substrate. Further, at least when the pretreatment gas includes oxygen, the resulting termination of the $SiO_2$ surface is highly resistant to recontamination from atmospheric moisture or hydrocarbons under typical clean room conditions so that the etch step on a pretreated wafer can be further delayed for a substantial time without loss of the uniformity benefit of the of the pretreatment step. Still further, for substrates which include exposed silicon on the surface which is not desired to be etched during the silicon oxide etch process, the process is especially advantageous when the pretreatment is UV/$F_2O_2$, as this treatment (using appropriate $F_2/O_2$ ratios) produces a very thin oxy-fluoride layer which passivates exposed silicon against etching during pretreatment, but which is readily removed during the subsequent oxide etch step.

DETAILED DESCRIPTION OF THE INVENTION

Figure 1:
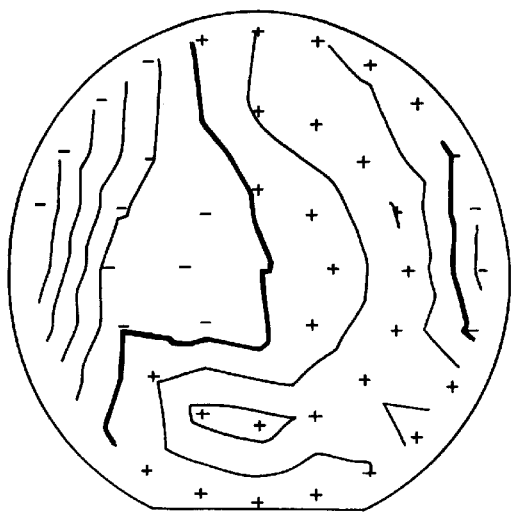
FIGS. 1–3 are contour maps of etched silicon dioxide wafers, etched as reported in Examples 1–3, respectively.

The substrate materials which can be treated by the present process can generally be any type of substrate material, but commonly will constitute Si, $SiO_2$ (including quartz) or gallium arsenide substrates. The substrate etch process may be a step in the manufacture of any manufactured article but has particular application in the manufacture of semiconductor devices, and micromachine structures.

The halogen gas is suitably fluorine, or chlorine. Bromine or an interhalogen such as $ClF_3$ may also be suitable but such gases are less preferred because of handling difficulty. The halogen gas is suitably supplied at a partial pressure of from about 10 mTorr to about ambient pressure. An inert gas, such as nitrogen, helium or argon, may be used as a diluent gas, especially at very low total gas pressures (below 10 Torr) where control of the halogen gas partial pressure may be difficult. Preferably the total gas pressure during the pretreatment step is from about 1 to about 500 torr.

In one embodiment of the invention a mixture of the halogen gas and oxygen is employed. Oxygen may be employed at a ratio of from 0 to 99.5% of the total gas volume. Oxygen rich mixtures, especially $O_2/F_2$ mixtures in volume ratio of about 99.5:0.5 to about 80:20, are advantageously employed as they provide a passivated surface which retains the ability to produce a reproducible etch uniformity even when the substrate is not immediately etched. For substrates which include areas of exposed silicon, such oxygen rich mixtures also suppress or eliminate silicon etching by the UV illuminated halogen gas.

UV irradiation is provided in the wavelength range of 180 to 600 nm. Broad spectrum sources providing output over this entire wavelength range can be used. However, narrower spectrum sources providing output over only a part of this range are also suitable if they provide a substantial portion of their output within the 180–420 nm range. Suitable sources are medium pressure Hg lamps and Xenon lamps. The UV radiation may be pulsed or continuous. A laser and suitable optics may also be used to generate the required UV photon flux. Substrate film and contaminant removal rates may be controlled to a large degree by the intensity of the UV radiation, the UV photon energy, the UV exposure time and/or the UV lamp or laser pulsing rate.

While UV irradiation is necessary to obtain a surface condition independent of handling history, the total UV dosage can be widely variable without influencing the pretreatment results. For instance in one set of experiments in a setup as described in the accompanying examples, total electrical energy input into the UV flashlamp varied from about 6,000 Joules to about 20,000 Joules without noticeable effect on the subsequent etch uniformity. However, UV dosage does affect substrate temperature and a consistent substrate temperature at initiation of the etch reaction is necessary for uniformity in etch depth results. Consequently, in the usual case where the $SiO_2$ etch will immediately follow the pretreatment step, the operator will want to control time, intensity and/or pulse frequency and duration of UV exposure so as to provide the substrate at a temperature suitable for etch processing without undue delay for substrate cooling or heating. The temperature of the substrate at initiation of the pretreatment step is suitably from about ambient temperature to about 250° C., preferably about 25° C. to about 50° C. Preferably the UV dosage is regulated so that the substrate temperature is between about 35° C. and about 75° C. at the end of the pretreatment reaction, more preferably not more than about 50° C.

The pretreating process suitably adds the process gas in a flowing system so as to allow for prompt removal of any reaction products. Total gas flow rates of 10 sccm to about 5000 sccm may be beneficially employed.

Pretreatment process times from 2 seconds to ten or more minutes may be employed. Shorter process times will be difficult to control reproducibly. Extended process times beyond about 3 minutes are undesirable as reducing throughput of the total process. A typical pretreatment process time will be in the range of from about 10 sec to about 90 sec.

In practice of the inventive method, a gas source is provided connected to a processing chamber containing the substrate material to be etched or cleaned. The processing chamber suitably comprises a vacuum vessel constructed of chemically inert material, which is hermetically sealed from the ambient atmosphere and can be evacuated below ambient pressure. The processing chamber is evacuated to a low base pressure. The substrate is desirably introduced into the processing chamber through an isolated load-lock chamber which can be pumped down to a similar base pressure. Introduction or removal of the substrate from the process chamber occurs through the load-lock chamber. Alternatively, the substrate may be introduced into the chamber before evacuation. The process gas or process gas mixture is then introduced into the chamber. UV illumination may be provided from an external lamp source through a UV transparent window in the chamber. Gas flow is desirably provided in an axisymmetric pattern over the wafer surface because the pretreatment step sets the wafer into a condition where non-uniformity in the reactor gas flow pattern, rather than storage history, appears to be the primary factor affecting uniformity of the etch results. However, excellent results can still be obtained using reactive gas flow patterns which are nonsymmetric.

The process chamber may also share a transfer interface with a vacuum cluster robotic transfer unit which allows sequential transfer of substrate materials to or from other process modules without exposure to ambient atmosphere.

Chamber apparatus designs suitable for the pretreatment process are the reaction chamber designs described in WO 96/19825.

The silicon oxide etch step of the process may be any known silicon oxide etch process and may be conducted immediately in the same reactor, or in a separate reactor to which the substrate is transferred upon completion of the pretreatment step, optionally after a storage delay. If the etch step is conducted in a different reactor it is preferred that transfer be accomplished robotically, suitably by a cluster tool handler, but this is not mandatory.

The silicon oxide etch step is most suitably a HF/catalyst etch reaction. The invention is especially suitable for such systems in which the catalyst is ROH, where R is H or alkyl, although other catalysts such as acetone may also be employed. Typical conditions for the silicon oxide etch are reported in the references described in the background section above. For etch reactions conducted at below ambient pressure an HF/alcohol etch regime is preferred.

The invention is illustrated by the following non-limiting examples.

EXAMPLES $UV/Cl_2$ and $UV/F_2/O_2$ pretreatment processes were run prior to HF/IPA silicon dioxide etch processes in a photochemical gas phase vacuum reactor. The UV source used for the pretreatments was a broadband (most power between 180 and 400 nm) 2000 watt xenon flashlamp. The substrates, 6 inch (150 mm) diameter silicon wafers, were covered with 4000 Å of thermal oxide generated in an oxidizing furnace. In each process, the oxide was partially consumed (<1000 Å) by the HF/IPA etch step. The resulting etch uniformity was measured with a mapping spectrometer using 49 points over a 137 mm test diameter.

The following processing sequence was used for all inventive experiments:

1) Run UV/halogen pretreatment process
2) Allow wafer to cool under vacuum (cooling time depends on UV pretreat process)
3) Run HF/IPA oxide etching process.

The following parameters were used for the UV/halogen pretreatment processes:

| Gas | Pressure (torr) | % Halogen | Flow (sccm) | Time (sec.) |
|---|---|---|---|---|
| $Cl_2$ | 10 | 100 | 200 | 10–90 |
| $F_2/O_2$ | 10 | 10 | 1000 | 5–30 |

Substrate temperatures were about 42° C. at the beginning of the pretreatment step. After irradiation the $Cl_2$ treated substrates ranged from 60–200° C. and the $F_2/O_2$ treated substrates ranged from 48–100° C.

The UV flashlamp was operated in a manner which provided 200 Joules of electrical input to the lamp per pulse. Pulse duration was 100 microseconds. Except for Example 14, the lamp was operated at 7 pulses/sec. In Example 14 the lamp was operated at 3 pulses/sec.

The following parameters were used for the oxide etch processes:

| Gas | Pressure (torr) | $HF:N_2:IPA$ ratio | Flow (sccm) | Time (sec) | Temp (° C.) |
|---|---|---|---|---|---|
| HF/IPA | 90 | 25:25:1 | 4000 | 60 | 45–55 |

Examples 1–3

These examples demonstrate that wafers with no pretreatment show increased etch non-uniformity as aging time increases whereas $UV/Cl_2$ pretreated wafers return to approximately the same etch uniformity independent of aging time. Note that in this experiment, mean etch depth varied because the HF/IPA processing temperature varied slightly from run to run.

Example 1

(Comparative example)

No pretreatment. A wafer fresh from the furnace was etched as indicated above. The mean etch depth was 365 Å.

The etch uniformity, measured as the % deviation from the mean at 1σ std dev was 3.55%

Example 2

(Comparative example)

No pretreatment; wafer aged in a cassette >1 day, followed by the same oxide etch. The mean etch depth was 346 Å; etch uniformity: 1σ=12.5%

Example 3

(Inventive example)

UV/$Cl_2$ (90 sec.) pretreatment; wafer aged in a cassette >1 day; same oxide etch. The mean etch depth was 582 Å; etch uniformity: 1σ=3.44%.

Figure 2:
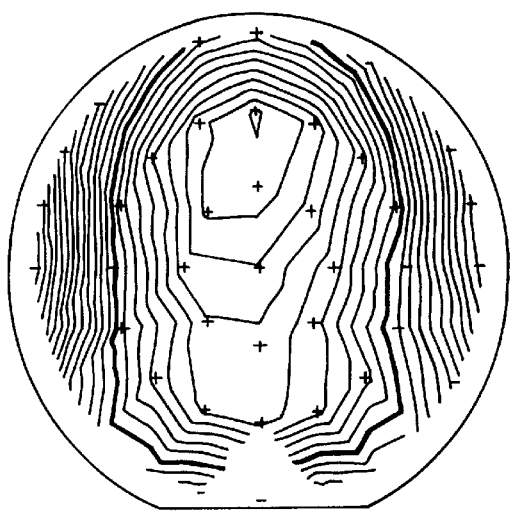
Figure 3:
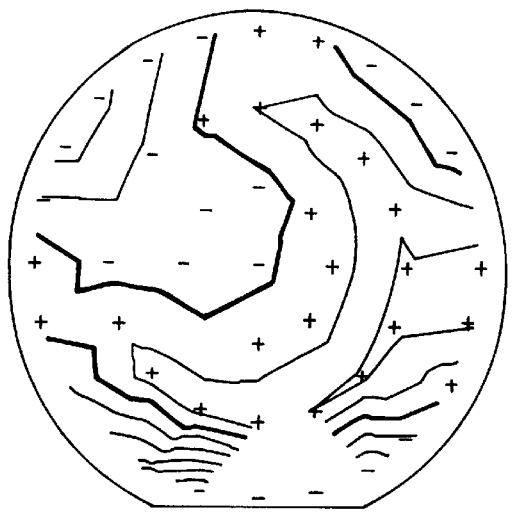

Drawing FIGS. 1–3 are contour maps of the etched wafers of Examples 1–3, respectively, with the bold line showing the mean etch depth. From these maps it can be seen that the etch uniformity pattern changes with aging and again with the pretreat step. In addition to better uniformity, the pre-treated wafer shows an etch pattern signature representative of chamber flow geometry. The aged wafer without pretreatment shows a z-axis symmetric etch pattern (no chamber flow geometry signature.)

Examples 4–6

These examples demonstrate that UV pretreatment alone or $Cl_2$ pretreatment alone cannot produce an etch uniformity result like the combined UV/$Cl_2$ pretreatment process.

Example 4

(Comparative example)

$Cl_2$ pretreatment (90 sec.) on a wafer aged in a storage cassette >1 day. The same oxide etch was used as in the previous examples. The mean etch depth was 426 Å; etch uniformity: 1σ=9.81%.

Example 5

(Comparative example)

UV pretreatment (90 sec.) on a wafer aged in cassette >1 day; same oxide etch. The mean etch depth was 474 Å; etch uniformity: 1σ=13.2%.

Example 6

(Inventive example)

UV/$Cl_2$ (90 sec) pretreatment; wafer aged in cassette >1 day; same oxide etch. The mean etch depth was 582 Å; etch uniformity: 1σ=3.44%

Examples 7–9

These examples demonstrate the UV/$F_2$/$O_2$ pretreatment process and performance compared to an untreated, etched wafer. Note that Example 9 has a significant delay between the pretreatment and the subsequent oxide etch. The results of Example 9 indicate that, in addition to pretreating the surface, the $F_2$/$O_2$ process also inhibits subsequent recontamination.

Example 7

(Comparative example)

No pretreatment wafer aged in cassette >1 day; same oxide etch. The mean etch depth was 208 Å; etch uniformity: 1σ=5.5%.

Example 8

(Inventive example)

UV/$F_2$/$O_2$ (30 sec.) pretreatment; wafer aged in cassette >1 day; same oxide etch. The mean etch depth was 229 Å; etch uniformity: 1σ=3.4%.

Example 9

(Inventive example)

UV/$F_2$/$O_2$ (30 sec) pretreatment; wafer aged in cassette >1 day; pretreatment was followed by 12 hours in cassette and then etching with same oxide etch. The mean etch depth 278 Å; etch uniformity: 1σ=3.6%.

Examples 10–15

Table 1 shows processing conditions for wafers which were stored in white polypropylene cassettes for I month after oxidizing, followed by pretreatment, if indicated; storage in black carbon-reinforced polypropylene storage cassettes under vaccuum for a time as indicated in the table; and then an HF/IPA as in the previous examples. The measured etch uniformity (1a deviation) results are reported in the Table. Examples 10–12 are comparative examples.

TABLE 1

| Example | Pretreatment | Storage time after pretreatment | Uniformity (1 σ) |
|---|---|---|---|
| 10 | none | 15 min | 4.0% |
| 11 | none | 2 hr | 5.6% |
| 12 | none | 24 hr | 8.9% |
| 13 | UV/$F_2$/$O_2$ (20 sec.) | 2 hr | 3.4% |
| 14 | UV/$F_2$/$O_2$ (20 sec.) | 24 hr | 3.0% |
| 15 | UV/$F_2$/$O_2$ (20 sec.) | 16 hr | 3.6% |

From the foregoing examples it can be seen that both the $Cl_2$ and the $F_2$/$O_2$ treatment processes resulted in measureable etching performance improvement. Both pretreatment processes resulted in improved within-wafer oxide etch uniformity compared to the HF/IPA process alone (no pretreatment). The pretreated etches always resulted in similar within-wafer uniformity independent of aging time or storage history after the pretreatment. That is the wafer surface condition was effectively set to a consistent starting condition, and retained it for an extended time. Conversely, the non-uniformity of the untreated HF/IPA etched wafers increased with aging time. Consequently, the oxide etch uniformity difference between pretreated and untreated wafers increased as the wafers were allowed to age in a plastic cassette. Further, pretreatments consisting of only UV (no halogen) or only halogen (no UV) resulted in no measureable etching performance improvement.

We claim:

1. A process for gas-phase etching of silicon oxide from a substrate comprising the steps of:
    a) pretreating the substrate within a process chamber by exposing it to UV illuminated halogen gas, and subsequently b) etching silicon oxide from the substrate using a gas-phase reactant system comprising HF and a catalyst.

2. The process of claim 1, wherein the gas-phase reactant system in step b) comprises HF.

3. The process of claim 2, wherein the gas-phase reactant system in step b) further comprises a catalyst.

4. The process of claim 1 wherein the catalyst is ROH, wherein R is H or an alkyl.

5. The process of claim 1 wherein, in step a), the halogen gas is fluorine, chlorine, bromine or an interhalogen.

6. The process of claim 5 wherein the halogen gas is in a mixture with up to 99.5% oxygen based on total gas volume in the process chamber.

7. The process of claim 6 wherein the halogen gas is fluorine and the volume ratio of oxygen to fluorine is from about 99.5:0.5 to about 80:20.

8. The process of claim 1 wherein the halogen gas is in a mixture with an inert gas.

9. The process of claim 1 wherein the substrate is made of Si, $SiO_2$, or gallium arsenide.

10. The process of claim 1, wherein the substrate is subjected to a storage interval between said pretreating and said etching steps.

11. The process as in claim 10 wherein the substrate is stored in a plastic container under vacuum during at least a part of said storage interval.

12. The process of claim 1, wherein the UV illumination is within the range 180–420 nm.

13. The process of claim 1, wherein the substrate temperature at the time the pretreating step is initiated is from about ambient temperature to about 250° C.

14. The process of claim 13 wherein the UV illumination is pulsed during said illumination step.

15. The process of claim 14 wherein the UV wherein the duration, frequency and flux of the UV pulses are controlled to provide a substrate temperature of between about 35° C. and about 75° C. at the end of the pretreatment step.

16. The process of claim 1 wherein the pressure in the process chamber during the pretreatment step is from about 10 mTorr to about ambient pressure.

17. The process of claim 16 wherein in step a), said halogen gas is provided optionally in admixture with oxygen or an inert gas or both in a flowing gas regime, the total gas flow rate being from 10 sccm to about 5000 sccm.

18. The process of claim 17 wherein said gas flow is provided in an axisymmetric flow pattern over the substrate.

19. The process of claim 5 wherein the halogen gas is chlorine gas.

20. A process for gas-phase etching of silicon oxide from a substrate comprising the steps of:
   a) pretreating the substrate within a process chamber by exposing it to UV illuminated halogen gas, and subsequently
   b) etching silicon oxide from the substrate using a gas-phase reactant system wherein the substrate is subjected to a storage interval between said pretreating and said etching steps.

21. A process for gas-phase etching of silicon oxide from a substrate comprising the steps of:
   a) pretreating the substrate within a process chamber by exposing it to UV illuminated halogen gas, and subsequently
   b) etching silicon oxide from the substrate using a gas-phase reactant system comprising an effective amount of a catalyst to catalyze the etching.

* * * * *

UNITED STATES PATENT AND TRADEMARK OFFICE
CERTIFICATE OF CORRECTION

PATENT NO. : 5,922,219
DATED : July 13, 1999
INVENTOR(S) : Robert T. Fayfield and Brent D. Schwab It is certified that error appears in the above-identified patent and that said Letters Patent is hereby corrected as shown below:

Column 1, line 7, please delete "hich" and replace with --which--.

Signed and Sealed this

Twenty-third Day of May, 2000

Attest:

Q. TODD DICKINSON

*Attesting Officer*　　　　　*Director of Patents and Trademarks*